US008447547B2

(12) United States Patent
Jung et al.

(10) Patent No.: US 8,447,547 B2
(45) Date of Patent: May 21, 2013

(54) STATIC NOISE MARGIN ESTIMATION (75) Inventors: Seong-Ook Jung, Seoul (KR);
Seung-Chul Song, Austin, TX (US);
Hyunkook Park, Seoul (KR)

(73) Assignee: QUALCOMM Incorporated, San Diego, CA (US)

( * ) Notice: Subject to any disclaimer, the term of this patent is extended or adjusted under 35 U.S.C. 154(b) by 492 days.

(21) Appl. No.: 12/485,969

(22) Filed: Jun. 17, 2009

(65) Prior Publication Data
US 2010/0324850 A1 Dec. 23, 2010

(51) Int. Cl.
G06F 17/18 (2006.01)
G06F 19/00 (2011.01)

(52) U.S. Cl.
USPC .............. 702/69; 702/179; 702/181

(58) Field of Classification Search
USPC ............ 702/69; 324/211, 613; 365/206
See application file for complete search history.

(56) References Cited

U.S. PATENT DOCUMENTS

| 2006/0205112 A1* | 9/2006 | Standing et al. ............ 438/106 |
| 2007/0025140 A1 | 2/2007 | Redwine | |
| 2008/0062746 A1 | 3/2008 | Loh et al. | |
| 2008/0209365 A1* | 8/2008 | Riviere-Cazaux ............ 716/4 |

OTHER PUBLICATIONS

Ichikawa, T.; Sasaki, M.; , "A new analytical model of SRAM cell stability in low-voltage operation," Electron Devices, IEEE Transactions on , vol. 43, No. 1, pp. 54-61, Jan. 1996 doi: 10.1109/16.477593 URL: http://ieeexplore.ieee.org/stamp/stamp.jsp?tp=&arnumber=477593&isnumber=10174.*
Calhoun, B.H.; Chandrakasan, A.; , "Analyzing static noise margin for sub-threshold SRAM in 65nm CMOS," Solid-State Circuits Conference, 2005. ESSCIRC 2005. Proceedings of the 31st European , vol., No., pp. 363-366, Sep. 12-16, 2005 doi: 10.1109/ESSCIR.2005. 1541635 URL: http://ieeexplore.ieee.org/stamp/stamp.jsp?tp=&arnumber=1541635&isnumber=32889.*
Peter Olofsson, Probability, Statistics, and Stochastic Process, 2005, John Wiley & Sons, Inc., pp. 214.*
Bhavnagarwala, A.J.; Xinghai Tang; Meindl, J.D.; , "The impact of intrinsic device fluctuations on CMOS SRAM cell stability," Solid-State Circuits, IEEE Journal of , vol. 36, No. 4, pp. 658-665, Apr. 2001 doi: 10.1109/4.913744 URL: http://ieeexplore.ieee.org/stamp/stamp.jsp?tp=&arnumber=913744&isnumber=19725.*
Srivastava, Rapid Estimation of the Probability of SRAM Failure due to MOS Threshold Variations, 2007, pp. 229-232.*
Engineering Statistic Handbook, May 1, 2006, NIST, PP Section 2.5.5 Propagation of error considerations URL: http://www.itl.nist.gov/div898/handbook/mpc/mpc.htm.*

(Continued)

*Primary Examiner* — Sujoy Kundu
*Assistant Examiner* — Michael Dalbo
(74) *Attorney, Agent, or Firm* — Sam Talpalatsky; Nicholas J. Pauley; Joseph Agusta (57) ABSTRACT In a particular embodiment, a method is disclosed that estimates a total static noise margin of a bit cell of a memory. The method includes determining a correlation coefficient of a left static noise margin of the bit cell as compared to a right static noise margin of the bit cell and estimating a total static noise margin of the bit cell by evaluating an analytical function based on the correlation coefficient.

37 Claims, 8 Drawing Sheets

OTHER PUBLICATIONS

Cheng et al., Impact of intrinsic parameter fluctuations in decanano MOSFETs on yield and functionality of SRAM cells,Solid-State Electronics 49 (2005) pp. 740-746.*

Rochester Institute of Technology, Noise and Random Processes: Correlation in Random Variables—Lecture 11, 2002. URL: http://www.cis.rit.edu/class/simg713/Lectures/Lecture713-11-4.pdf.*

International Search Report—PCT/ US2010/039080, International Search Authority—European Patent Office Oct. 6, 2010.

Written Opinion—PCT/ US2010/039080, International Search Authority—European Patent Office Oct. 6, 2010.

Srivastava S et al: "Rapid Estimation of the Probability of SRAM Failure due to MOS Threshold Variations" Custom Integrated Circuits Conference, 2007. CICC '07. IEEE, IEEE, Piscataway, NJ, USA, Sep. 16, 2007, pp. 229-232, XP031223580, ISBN: 978-1-4244-0786-6, p. 365, left-hand column, paragraph 2—right-hand column, paragraph 3; figures 6-8.

International Search Report and Written Opinion—PCT/US2010/039080, International Search Authority—European Patent Office—Jun. 10, 2010.

Srivastava S et al: "Rapid Estimation o f the Probability of SRAM Failure due to MOS Threshold Variations" Custom Integrated Circuits Conference, 2007, CICC '07. IEEE , IEEE , Piscataway, NJ, USA, Sep. 16, 2007, pp. 229-232, XP031223580 ISBN: 978-1-4244-0786-6 p. 365, left-hand column, paragraph 2—right-hand column paragraph 3; figures ; 6-8.

Calhoun, B.H. et al. "Analyzing static noise margin for sub-threshold SRAM in 65nm CMOS," Proc. ESSCIRC 2005, pp. 12-15, Sep. 2005.

Craig, M. et al. "Robust methodology for state-of-the-art embedded SRAM bitcell design," Proc. SPIE vol. 4692, p. 380-389, Jul. 2002, Design, Process Integration, and Characterization for Microelectronics, Alexander Starikov; Kenneth W. Tobin; Eds.

* cited by examiner

STATIC NOISE MARGIN ESTIMATION

I. FIELD OF THE DISCLOSURE

The present disclosure is generally related to memory devices, and more particularly, is related to static noise margin estimation of memory cell architectures.

II. BACKGROUND

Advances in technology have resulted in smaller and more powerful personal computing devices. While reducing power consumption, the associated reduction of transistor size and operating voltages also increases sensitivity to noise and to manufacturing process variations.

Such advances present challenges to achieving correct operation of static random access memory (SRAM) under varying conditions. An SRAM cell should be stable enough to be read without changing the data in the cell. Static noise margin is a measure of the read stability of the cell. The static noise margin is the amount of noise that can be imposed on the internal nodes of the SRAM cell before the cell changes its state. The ability to accurately estimate static noise margin is useful in the SRAM design process.

III. SUMMARY

A particular embodiment of a method estimates a total static noise margin of a bit cell of a memory. The method includes generating a correlation coefficient using both left and right static noise margins of a bit cell. A total static noise margin of the bit cell may be estimated by evaluating an analytical function based on the correlation coefficient. The analytical function may be further based on a mean value of either the left static noise margin or the right static noise margin. The analytical function may further be based on a standard deviation value of either the left static noise margin or the right static noise margin.

In another particular embodiment, a method is disclosed that estimates a total static noise margin of a bit cell of a memory based on a left side static noise margin of the bit cell and a right side static noise margin of the bit cell. The method includes accessing size information for each of a plurality of transistors within the bit cell and calculating a voltage versus current model for each of the transistors to generate a voltage transfer curve and to calculate a static noise margin for the bit cell based on a butterfly curve obtained from a voltage transfer curve. The method further includes determining a mean value of the static noise margin of the bit cell. The sensitivity of the static noise margin calculations for each of the plurality of transistors is determined. The method includes determining a standard deviation value of the bit cell and determining a correlation coefficient of the left static noise margin as compared to the right static noise margin. The method estimates a total static noise margin of the bit cell by evaluating an analytical function based on the mean value, the standard deviation value, and the correlation coefficient.

In another particular embodiment, a computer readable medium stores computer executable code for estimating a total static noise margin of a bit cell of a memory. The computer readable medium stores code executable by the computer to determine a correlation coefficient of a left static noise margin of the bit cell as compared to a right static noise margin of the bit cell. The computer readable medium further stores code executable by the computer to estimate a total static noise margin of the bit cell by evaluating an analytical function based on the correlation coefficient.

In another particular embodiment, an apparatus is configured for estimating a total static noise margin of a bit cell of a memory. The apparatus includes means for determining a correlation coefficient of a left static noise margin of the bit cell as compared to a right static noise margin of the bit cell. The apparatus further includes means for estimating a total static noise margin of the bit cell by evaluating an analytical function based on the correlation coefficient.

In another particular embodiment, an apparatus is configured for designing a bit cell memory. The apparatus includes a processor and a memory that includes code executable by the processor to determine a correlation coefficient of a left static noise margin of the bit cell as compared to a right static noise margin of the bit cell. The code may be executed to estimate a total static noise margin of the bit cell by evaluating an analytical function based on the correlation coefficient and to perform an iterative process of bit cell parameter changes to modify the bit cell memory design.

Particular advantages provided by disclosed embodiments may include reduced simulation time and processing. Calculations that include both the left and right static noise margin components generate more accurate estimations. Embodiments may accurately estimate the tail edge of a static noise margin distribution to improve stability of a bit cell design.

Other aspects, advantages, and features of the present disclosure will become apparent after review of the entire application, including the following sections: Brief Description of the Drawings, Detailed Description, and the Claims.

V. DETAILED DESCRIPTION

Figure 1:
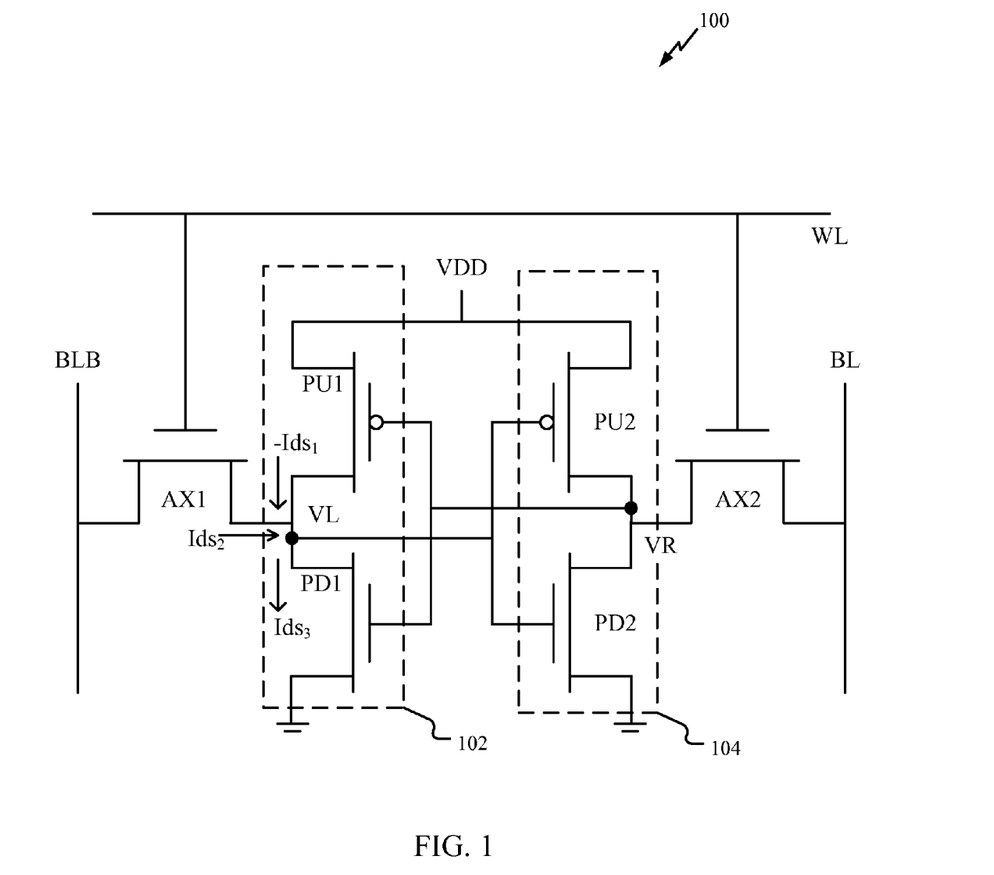
FIG. 1 is a diagram of a particular illustrative embodiment of an SRAM memory cell having static noise margin characteristics.

FIG. 1 shows an illustrative memory cell design 100. The memory cell design 100 includes a six-transistor complementary metal-oxide-semiconductor (CMOS) SRAMs. The SRAMs include two cross-coupled inverters 102, 104 that combine to store one bit of information. Two access transistors AX1, AX2 on both sides of the memory cell design 100 connect the memory cell to two bitlines, bitline (BL) and bitline bar (BLB). Typically, the storage state of the memory cell design 100 (i.e., "logic 0" or "logic 1") is stored at the output of one of the inverters (e.g., inverter 102) while the output of the other inverter (e.g., inverter 104) is the inverse, or complement, of this storage state. The access transistors AX1, AX2 may protect the data value stored in the memory cell when the memory cell is not being accessed.

The memory cell design 100 includes a first inverter 102 comprising a first transistor PD1 and a second transistor PU1. PU1 may include a p-type metal-oxide-semiconductor field effect transistor (MOSFET), and PD1 may include an n-type MOSFET. The first inverter 102 may have an input at a connection between gates of PD1 and PU1 and an output at a storage node $V_L$. The memory cell design 100 also includes a second inverter 104 comprising a third transistor PD2 and a fourth transistor PU2. PU2 may include a p-type metal-oxide-semiconductor field effect transistor (MOSFET), and PD2 may include an n-type MOSFET. The second inverter 104 may have an input at a connection between the gates of PD2 and PU2. The second inverter 104 may include an output at a right side storage node ($V_R$). A left side storage node ($V_L$) is connected to the gates of PD2 and PU2, and the right side storage node $V_R$ is connected to the gates of PD1 and PU1 in a cross-coupled configuration.

During a read mode operation, bitlines BL and BLB may be initially pre-charged to a high logic state voltage (e.g., supply voltage VDD), and then set into a high impedance state. A wordline WL may be activated. The access transistors AX1, AX2 may be turned on so that voltages on the outputs of the inverters 102, 104 can be sensed. The inverters 102, 104 may act to discharge either BL or BLB to ground $V_{ss}$ depending on the stored state of the memory cell. Thus, in a read mode operation, the inverters 102, 104 drive the bitlines BL, BLB. The state of bitlines BL and BLB may subsequently be determined by external logic circuitry to determine the storage state of the memory cell design 100.

To write new data into the memory cell design 100, external drivers may be activated to drive the bitlines BL, BLB to the intended storage values for storage nodes $V_L$ and $V_R$. Wordline WL may be set high and the access transistors AX1, AX2 may be turned on. The voltage on bitline bar BLB may be the complement of the voltage on bitline BL. Since the external drivers are larger than the relatively small transistors used in the SRAM memory cell design, they supply enough current to override the previous state of the cross-coupled inverters 102, 104.

FIG. 1 thus shows a memory cell 100 having parameters that may be adjusted to compensate for static noise margin. Illustrative parameters may include the drain to source resistance and the voltage between the drain and the source, as well as effective channel widths and lengths of the memory cell components. Embodiments may evaluate the right and left static noise margins of the memory cell 100 to estimate the total static noise margin of the memory cell 100.

Figure 2:
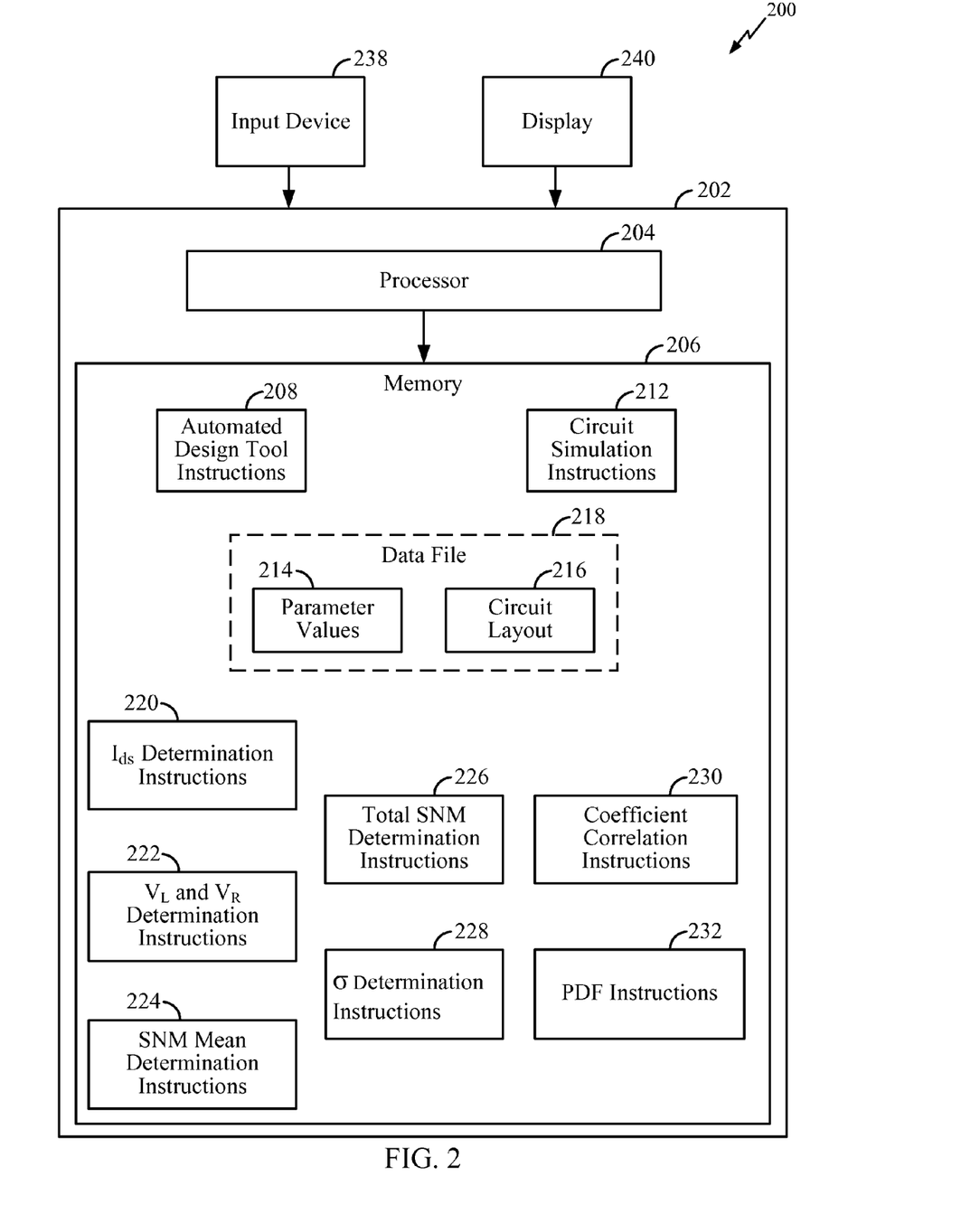
FIG. 2 is a block diagram of particular illustrative embodiment of a system to estimate the static noise margin of the SRAM memory cell design of FIG. 1.

Referring to FIG. 2, a block diagram of particular illustrative embodiment of a system to estimate a static noise margin is depicted and generally designated 200. In a particular embodiment, the system 200 may be configured to estimate the static noise margin for the memory cell design 100 of FIG. 1. The system 200 includes a device 202 having at least one processor 204 and a memory 206 that is accessible to the processor 204. The memory 206 includes media that is readable by the processor 204 and that stores data and program instructions that are executable by the processor 204, including automated design tool instructions 208, circuit simulation instructions 212, and a computer readable data file 218 that includes parameter values 214 and a circuit layout 216. The memory also includes: drain to source current ($I_{ds}$) determination instructions 220, left side voltage (VL) and right side voltage (VR) determination instructions 222, static noise margin mean determination instructions 224, total static noise margin determination instructions 226, standard deviation determination instructions 228, coefficient correlation instructions 230, and probability distribution instructions 232.

An input device 238 and a display 240 are coupled to the device 202. In a particular embodiment, the input device 238 may include a keyboard, a pointing device, a touch screen, a speech interface, another device to receive user input, or any combination thereof.

In a particular embodiment, the automated design tool instructions 208 are executable by the processor 204 to enable a user to design a circuit via the input device 238 and the display 240, and to store data associated with elements and connections of the circuit as the circuit layout 216. One or more device or circuit parameters associated with the circuit may be stored as parameter values 214. The circuit simulation instructions 212 may be executable by the processor 204 to read data from the data file 218 and to perform one or more simulations to model a behavior of the circuit. The instructions 220, 222, 224, 226, 228, 230, and 232 may be executable by the processor 204 to cause the processor 204 to estimate the static noise margin for a circuit, such as a the memory cell design 100 depicted in FIG. 1, in conjunction with the circuit simulation instructions 212.

The value $I_{ds}$ may be calculated using the $I_{ds}$ determination instructions 220 of FIG. 2. The $I_{ds}$ of one embodiment may be calculated for each current path $I_{ds1}$, $I_{ds2}$, and $I_{ds3}$ flowing into $V_L$, as shown in FIG. 1. The $I_{ds}$ determination instructions 220 for this purpose may execute the equation:

$$I_{ds} = [(I_{ds0} \times NF)/1 + (R_{ds} \times I_{ds0})/V_{dseff}] \times [1+1/C_{clm} \times ln(V_A/V_{Asat})] \times [1+(V_{ds}-V_{dseff})/V_{ADIBL}] \times [1+(V_{ds}-V_{dseff})/V_{ADITS}] \times [1+(V_{ds}-V_{dseff})/V_{ASCBE}].$$

In the above equation, $I_{ds0} = [(W_{eff} \times \mu_{eff} \times C_{coxeff} \times V_{gsteff} \times V_{dsteff}) \times [1+V_{dseff}/[2 \times (V_{gsteff}+2V_t)/A_{bulk}]]]/[L_{eff} \times [1+(V_{dseff}/(E_{sat} \times L_{eff})]]$. $R_{ds}$ is a drain to source resistance of a transistor PU1, PD1, or AX1 in one of the current paths $I_{ds1}$, $I_{ds2}$, or $I_{ds3}$. $V_{ds}$ is a voltage between the drain and the source of a transistor PU1, PD1, or AX1. $V_{dseff}$ is an effective voltage between the drain and the source of one of the transistors PU1, PD1, or AX1, and $V_A$ is an Early voltage. $V_{Asat}$ is an Early voltage of the memory cell 100 in a saturated state. $V_{ASCBE}$ is an Early voltage due to a substrate current induced body effect. $W_{eff}$ is an effective channel width of one of the transistors PU1, PD1, or AX1, and $L_{eff}$ is an effective channel length of the transistor PU1, PD1, or AX1. $E_{sat}$ is the carrier velocity saturation electric field, and $A_{bulk}$ is a bulk lattice constant of the transistor PU1, PD1, or AX1.

Left side voltage ($V_L$) and right side voltage ($V_R$) determination instructions 222 may use the $I_{ds}$ determinations to calculate $V_L$ and $V_R$. For example, $V_L$ and $V_R$ may both be determined according to using Kirchoff's Current Law: $I_{ds1} - I_{ds2} + I_{ds3} = 0$. In an illustrative embodiment, $I_{ds}$ for any transistor of the memory cell design 100 of FIG. 1 can be calculated as a function of the transistor's drain voltage, gate voltage (i.e. $V_L$ or $V_R$), source voltage, supply voltage, transistor width, transistor length, and transistor type (i.e. NMOS or PMOS) using a model based on one or more of the transistor's physical parameters, one or more curve fitting parameters, or a combination thereof. As a result, for each selected value of $V_R$, a corresponding value of $V_L$ may be determined that satisfies Kirchoff's Current Law, such as by using a Newton-Ralphson method, as an illustrative example. The resulting set of corresponding $V_R$ and $V_L$ values may be used to generate a voltage transfer curve.

The static noise margin mean determination instructions 224 may measure the parameters from the modeled data to determine the respective means of the left and right static noise margins. For example, the total static noise margin determination instructions 226 may plot a voltage transfer curve of one half of the SRAM cell together with the inverse of the voltage transfer curve of the other half of the memory cell design 100. The resultant "butterfly curve" may include dimensions that can be analyzed to determine the static noise margin.

An embodiment may further determine the standard deviation of threshold voltage variation of each transistor PU1, PU2, PD1, PD2, AX1, and AX2. For instance, the total static noise margin determination instructions 226 may calculate the standard deviation of the threshold voltage variation of each transistor PU1, PU2, PD1, PD2, AX1, and AX2 according to: $\sigma_{Vt}=A_{Vt}/\text{sqrt}(L_{eff} \times W_{eff})$. In the equation, $A_{Vt}$ is the mismatch figure of merit value; $L_{eff}$ is the effective channel length of a transistor PU1, PU2, PD1, PD2, AX1, or AX2, and $W_{eff}$ is the effective channel width of the transistor PU1, PU2, PD1, PD2, AX1, or AX2. The $\sigma_{Vt}$ value for each transistor PU1, PU2, PD1, PD2, AX1, or AX2 may be used to determine a standard deviation of static noise margin and a correlation coefficient used to estimate the static noise margin, as discussed herein.

The mean static noise margin ($\mu_{SNM}$) may be calculated for each transistor PU1, PU2, PD1, PD2, AX1, and AX2 using a plotted transfer curve, as discussed herein. The sensitivity of the static noise margin according to the threshold voltage of a specific MOSFET may be determined according to: $\partial SNM_{MOSFET}/\partial V_{thMOSFET}$. In the foregoing equation, $\partial SNM_{MOSFET}/\partial V_{thMOSFET}$ is the partial derivative of the static noise margin according to the threshold voltage of the MOSFET. To first order, $\partial SNM_{MOSFET}/\partial V_{thMOSFET}$ can be computed using a differential value of the static noise margin by introducing a variation in a threshold voltage $\Delta V_{th}$ of the particular device and determining a resulting change in static noise margin. In a particular embodiment, four sets of $V_L$, $V_R$ data may be obtained (e.g. by introducing a $\Delta V_{th}$ to each of PU1, PD1, and AX1 independently, in addition to a set of data with $\Delta V_{th}=0$ for all devices) and $\partial SNM_{MOSFET}/\partial V_{thMOSFET}$ can be computed for each device based on the resulting data (e.g. by analyzing differences in the resulting butterfly curves).

The standard deviation determination instructions 228 may be used to calculate the variation, or standard deviation ($\sigma_{SNM}$), for the static noise margin according to the equation:

$$\sigma_{SNM} = \text{sqrt} [(\sigma_{Vt\_PU1} \times \partial SNM_{PU1}/\partial V_{th\_PU1})^2 + (\sigma_{Vt\_PU2} \times \partial SNM_{PU2}/\partial V_{th\_PU2})^2 + (\sigma_{Vt\_PD1} \times \partial SNM_{PD1}/\partial V_{th\_PD1})^2 + (\sigma_{Vt\_PD2} \times \partial SNM_{PD2}/\partial V_{th\_PD2})^2 + (\sigma_{Vt\_AX1} \times \partial SNM_{AX1}/\partial V_{th\_AX1})^2 + (\sigma_{Vt\_AX2} \times \partial SNM_{AX2}/\partial V_{th\_AX2})^2].$$

The above equation may be executed by the system 200 of FIG. 2 to determine the standard deviation in a faster manner than conventional systems that rely upon Monte Carlo simulations. As such, the disclosed method of calculating total static noise margin reduces processing time. As discussed herein, the standard deviation value may be used to determine the correlation coefficient that ultimately facilitates the calculation of the static noise margin.

Coefficient correlation instructions 230 may be configured to determine a correlation coefficient between the determined left and right static noise margins. For example, the coefficient correlation instructions 230 may calculate the total correlation coefficient according to:

$$\rho_{SNM_L}, \rho_{SNM_R} = [\partial SNM_{LPU1}/\partial V_{thPU1} \times \partial SNM_{RPU1}/ \partial V_{thPU1} \times \sigma_{VtPU1}^2 + \partial SNM_{LPU2}/\partial V_{thPU2} \times \partial SNM_{RPU2}/ \partial V_{thPU2} \times \sigma_{VtPU2}^2 + \partial SNM_{LPD1}/\partial V_{thPD1} \times \partial SNM_{RPD1}/ \partial V_{thPD1} \times \sigma_{VtPD1}^2 + \partial SNM_{LPD2}/\partial V_{thPD2} \times \partial SNM_{RPD2}/ \partial V_{thPD2} \times \sigma_{VtPD2}^2 + \partial SNM_{LAX1}/\partial V_{thAX1} \times \partial SNM_{RAX1}/ \partial V_{thAX1} \times \sigma_{VtAX1}^2 + \partial SNM_{LAX2}/\partial V_{thAX2} \times \partial SNM_{RAX2}/ \partial V_{thAX2} \times \sigma_{VtAX2}^2]/\sigma_{SNM}^2.$$

Probability distribution instructions 232 may be configured to plot an analytical, probability distribution function used to estimate the static noise margin operating parameters. For example, the probability distribution function may plot the probability distribution function according to the equation: $f_s(s)=2f_x(s) \times [1-\Phi(s-\mu(s))/\sigma]$. In the preceding equation, $f_x(x)=[1/\sigma_{SNM}\sqrt{(2\pi)}] \times e^{-(x-\mu SNM)^2/2\sigma SNM^2}$. The function $\mu(x)$ may be determined according to: $\mu_{SNM}+\rho_{SNM_L}$, $\rho_{SNM_R} \times (x-\mu_{SNM})$, and $\sigma=\sigma_{SNM} \times \text{sqrt}(1-\rho_{SNM_L}, \rho_{SNM_R}^2)$.

The instructions 220, 222, 224, 226, 228, 230, and 232 may also be executable by the processor 204 to store a value associated with a circuit parameter after the desired static noise margin is achieved. For example, one or more values associated with a parameter, such as $R_{ds}$, $V_{ds}$, $V_A$, $W_{eff}$, $L_{eff}$, $A_{bulk}$, and other values associated with physical properties of circuit elements, may be stored with the parameter values 214. The data file 218 may be output to represent a circuit layout 216 having the desired static noise margin.

Although depicted as separate components, the automated design tool instructions 208, the instructions 220, 222, 224, 226, 228, 230, and 232, the circuit simulation instructions 212, or any combination thereof, may be integrated into a single software package or software applications. As an illustrative, non-limiting example, the automated design tool instructions 208 and the circuit simulation instructions 212 may be portions of a commercial computer-aided design (CAD) tool, and the instructions 220, 222, 224, 226, 228, 230, and 232 may be implemented as scripts or other instructions compatible to be used with the commercial CAD tool.

FIG. 2 thus shows a device 202 that includes programs for facilitating the estimation of the total static noise margin. The device 202 may execute instructions to estimate the static noise margin based on operating parameters for a memory cell design 100.

Figure 3:
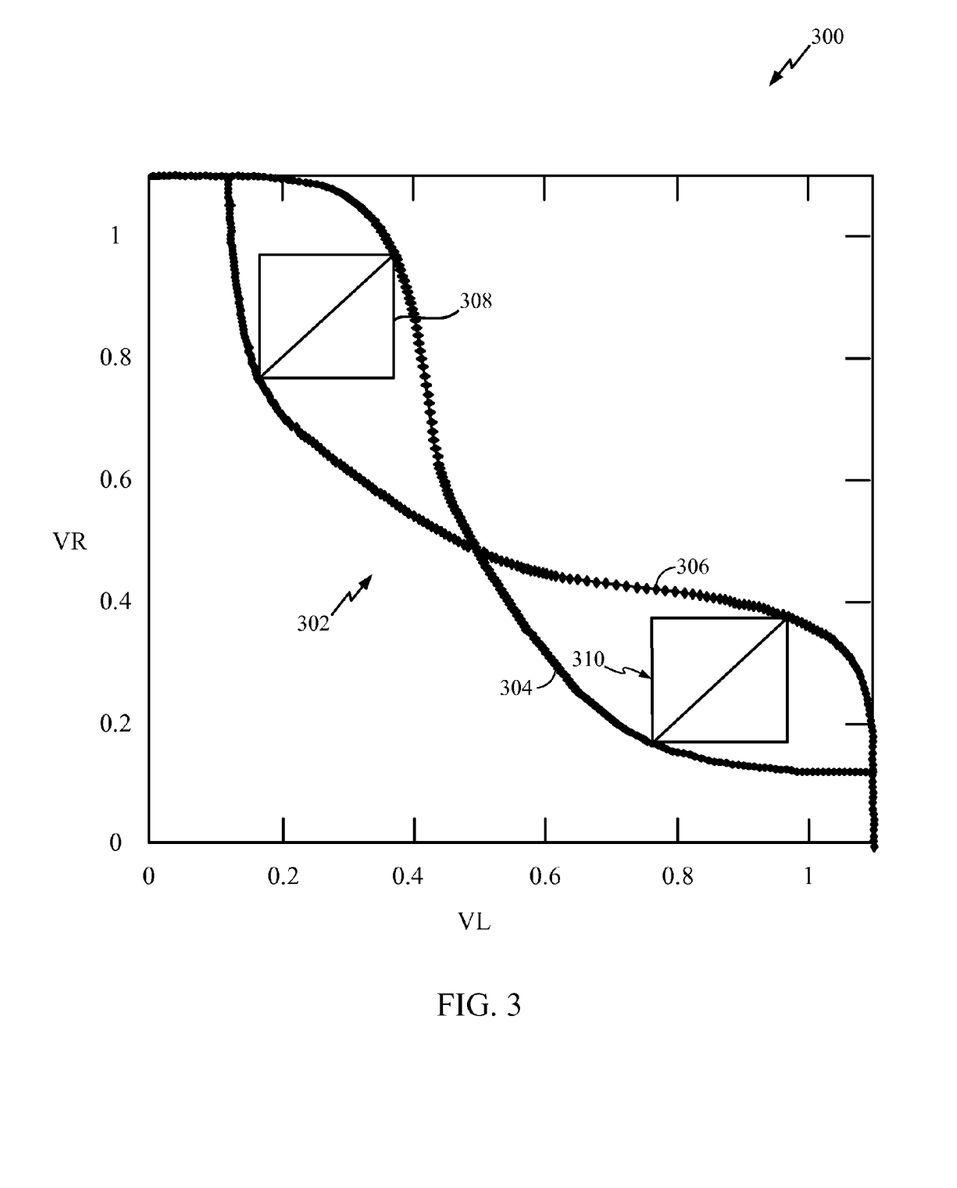
FIG. 3 is a graphical representation depicting static noise margin in the memory cell shown in FIG. 1.

FIG. 3 is a graphical representation 300 depicting a particular embodiment of a static noise margin for the six-transistor memory cell 100 shown in FIG. 1. As shown in FIG. 3, the illustrative butterfly curve 302 for the memory cell 100 may include two curves 304, 306 representing the transfer characteristics of the two inverters 102, 104 of FIG. 1. The butterfly curve 302 is plotted on a graph including $V_L$ on its x-axis and $V_R$ on its y-axis. In one embodiment, the static noise margin is determined by plotting the voltage transfer curve 304 of the right hand half of the memory cell 100 together with the inverse of the voltage transfer curve 306 of the left hand half of the memory cell 100. The curves 304, 306 may be overlaid on top of one another under worst case stability conditions.

The butterfly curve 302 of FIG. 3 may include eye portions 308, 310. In general, the larger the eye portions 308, 310 bounded by the two curves 304, 306, the more stable the memory cell. Static noise margin may be defined as a side of the largest square that can be drawn within the eye portions 308, 310. The sides of the largest squares that can be drawn inside the eye portions are $SNM_R$ and $SNM_L$.

FIG. 3 thus shows a butterfly curve 302 that may be generated to evaluate static noise margins for the left and right sides of the memory cell design 100 of FIG. 1. Measurements from the butterfly curve 302 may facilitate the estimation of the total static noise margin.

Figure 4:
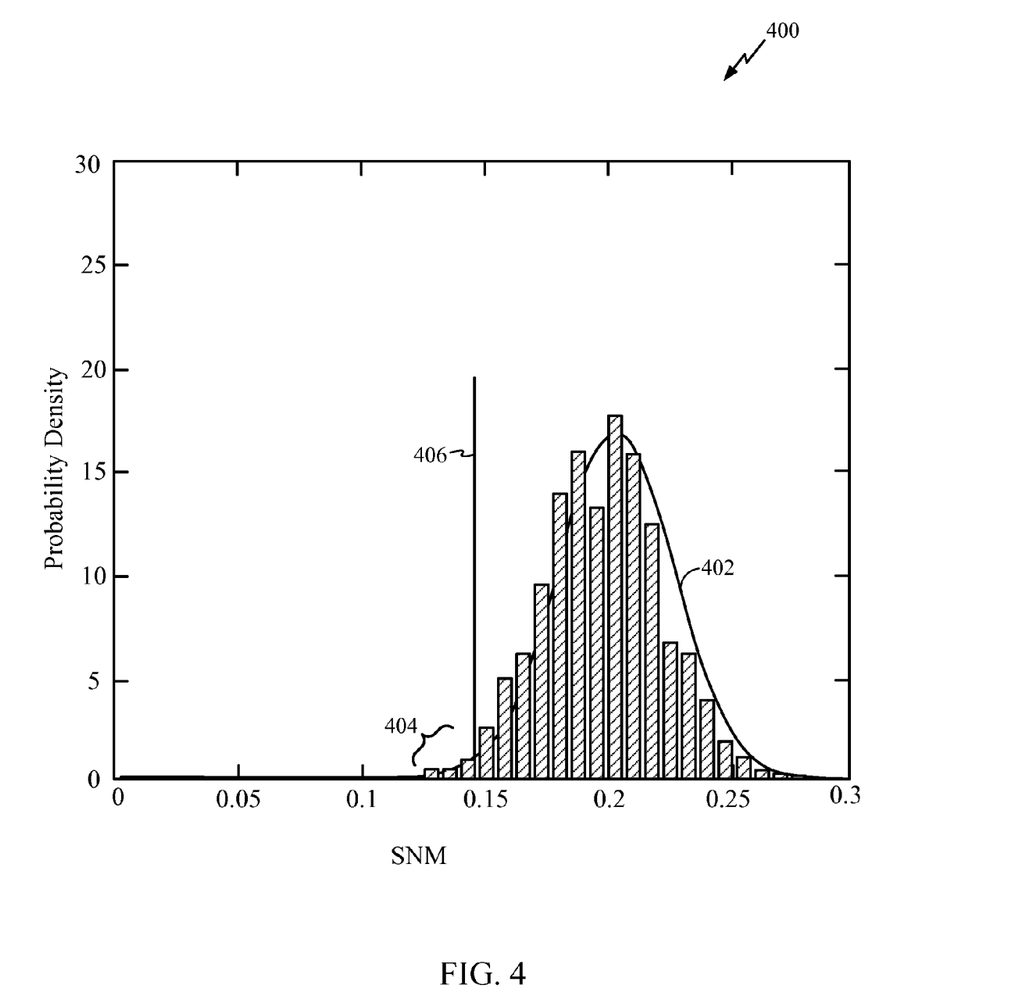
FIG. 4 is a probability distribution function curve that may be generated using the system of FIG. 2 to estimate the static noise margin of the memory cell of FIG. 1.

FIG. 4 shows a probability distribution function curve 402 that may be generated using the system 200 of FIG. 2. The curve 402 includes data points plotted on a graph 400 that includes static noise margin values on its x-axis and the probability distribution on its y-axis. The probability distribution function curve 402 may be plotted according to the analytical function: $f_s(s)=2f_x(s)\times[1-\Phi(s-\mu(s))/\sigma]$.

The generated probability distribution function curve 402 includes a tail edge portion 404 plotted to the left of a threshold line 406. The tail edge portion 404 may correspond with a portion of the static noise margin that is prone to instability for a given design. The probability distribution function curve 402 may be used to estimate the static noise margin. Processes of particular embodiments may accurately estimate the tail edge of a static noise margin distribution to improve stability of a bit cell design.

The processes of particular embodiments may plot results comparable to those generated using relatively more time consuming and costly simulation programs. For example, the probability distribution function curve 402 is plotted with bars 408 of the graph that represent a simulation result generated by a variation of a Simulation Program with Integrated Circuit Emphasis, i.e., a HSPICE Monte Carlo simulation. To obtain a useful Monte Carlo simulation result, large numbers of trials in Monte Carlo simulation are conventionally required, which is time consuming task. A failure to perform the time consuming trials may result in an inaccurate estimation of a left tail edge of the static noise margin distribution. As shown in FIG. 4, the curve 402 obtained using the analytical equation of a particular embodiment is well matched with the Monte Carlo simulation bars 408.

FIG. 4 thus shows a probability distribution generated by use of an analytical function that uses a correlation coefficient based on left and right side static noise margins as compared to Monte Carlo simulation results that may be significantly more time consuming and prone to inaccuracy in the left tail edge with a limited number of trials. The probability distribution function curve 402 may be used to estimate the total static noise margin with reduced processing and time requirements.

Figure 5:
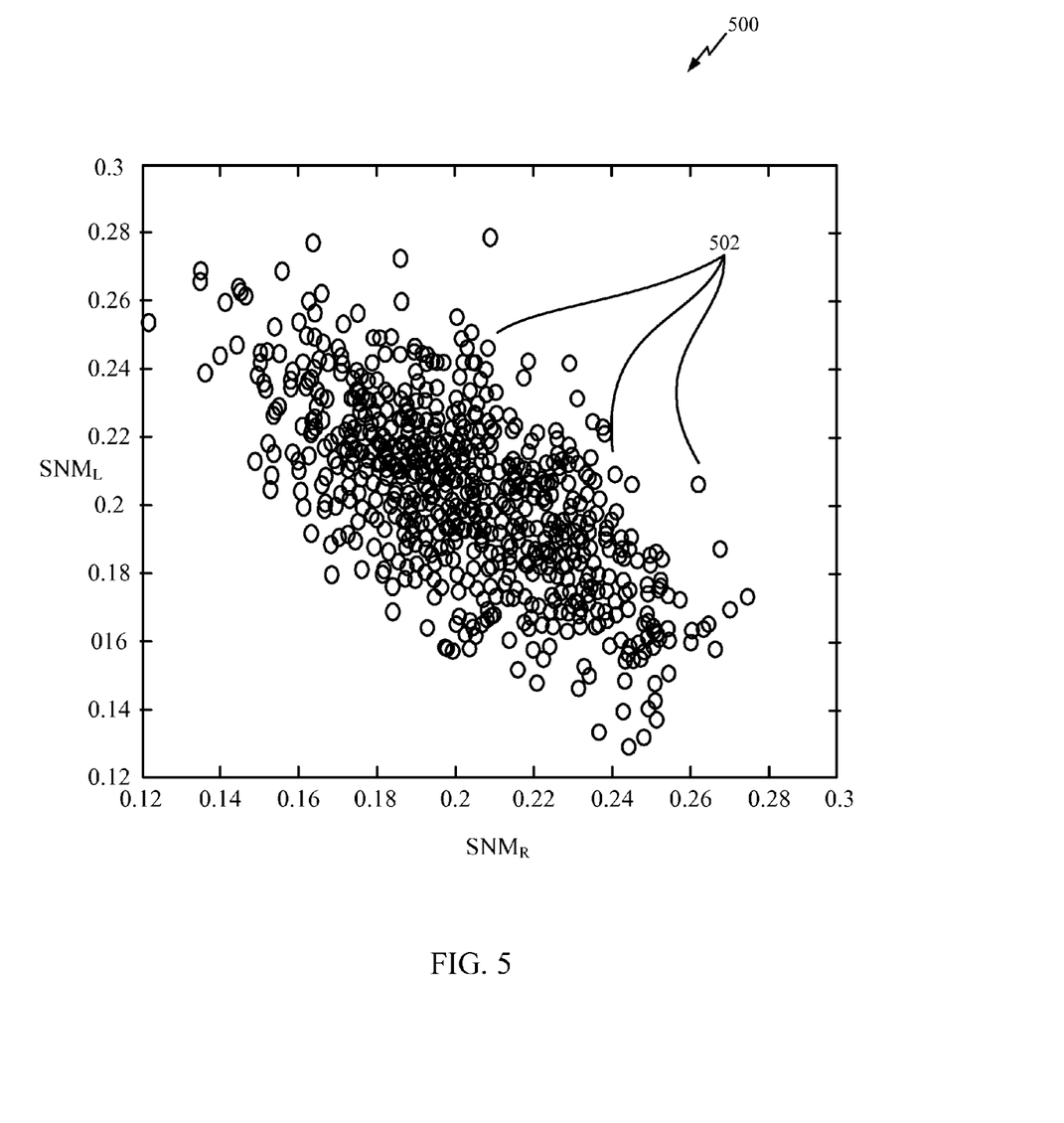
FIG. 5 is graph having plotted points representative of a correlation between the left and right components of static noise margin of the memory cell of FIG. 1.

FIG. 5 shows points plotted on a graph 500 representative of a correlation between the left and right components of static noise margin. The y-axis includes values of the left static noise margin, and the x-axis includes right static noise margin values. The points 502 on the graph 500 may be plotted using a Monte Carlo simulation and used to compute a correlation coefficient in a time-consuming simulation process. The correlation coefficient may change according to variation of the left or right parameters of the static noise margin. However, rather than using a Monte Carlo simulation, the correlation coefficient may instead be calculated using the following analytical equation:

$$\rho_{SNM_L}, \rho_{SNM_R} = [\partial SNM_{L_{PU1}}/\partial V_{th_{PU1}} \times \partial SNM_{R_{PU1}}/ \partial V_{th_{PU1}} \times \sigma_{Vt_{PU1}}^2 + \partial SNM_{L_{PU2}}/\partial V_{th_{PU2}} \times \partial SNM_{R_{PU2}}/ \partial V_{th_{PU2}} \times \sigma_{Vt_{PU2}}^2 + \partial SNM_{L_{PD1}}/\partial V_{th_{PD1}} \times \partial SNM_{R_{PD1}}/ \partial V_{th_{PD1}} \times \sigma_{Vt_{PD1}}^2 + \partial SNM_{L_{PD2}}/\partial V_{th_{PD2}} \times \partial SNM_{R_{PD2}}/ \partial V_{th_{PD2}} \times \sigma_{Vt_{PD2}}^2 + \partial SNM_{L_{AX1}}/\partial V_{th_{AX1}} \times \partial SNM_{R_{AX1}}/ \partial V_{th_{AX1}} \times \sigma_{Vt_{AX1}}^2 + \partial SNM_{L_{AX2}}/\partial V_{th_{AX2}} \times \partial SNM_{R_{AX2}}/ \partial V_{th_{AX2}} \times \sigma_{Vt_{AX2}}^2]/\sigma_{SNM}^2.$$

The analytical equation results can be very well matched to Monte Carlo simulation results and computed significantly faster than by Monte Carlo simulation. For example, the following table depicts correlation coefficient values determined using a Monte Carlo simulation compared to values determined using the analytic equation for various supply voltages:

| | $\rho_{SNM_L}, \rho_{SNM_R}$ | |
|---|---|---|
| $V_{DD}$ | Monte Carlo | Analytical Equation |
| 1.1 V | −0.656 | −0.660 |
| 0.9 V | −0.684 | −0.693 |
| 0.7 V | −0.600 | −0.617 |
| 0.5 V | −0.474 | −0.482 |

FIG. 5 thus shows points 502 that are plotted using data from both the right and left static noise margins. A calculated correlation coefficient may be used in a function to estimate the total static noise margin of the memory cell design 100 of FIG. 1.

Figure 6:
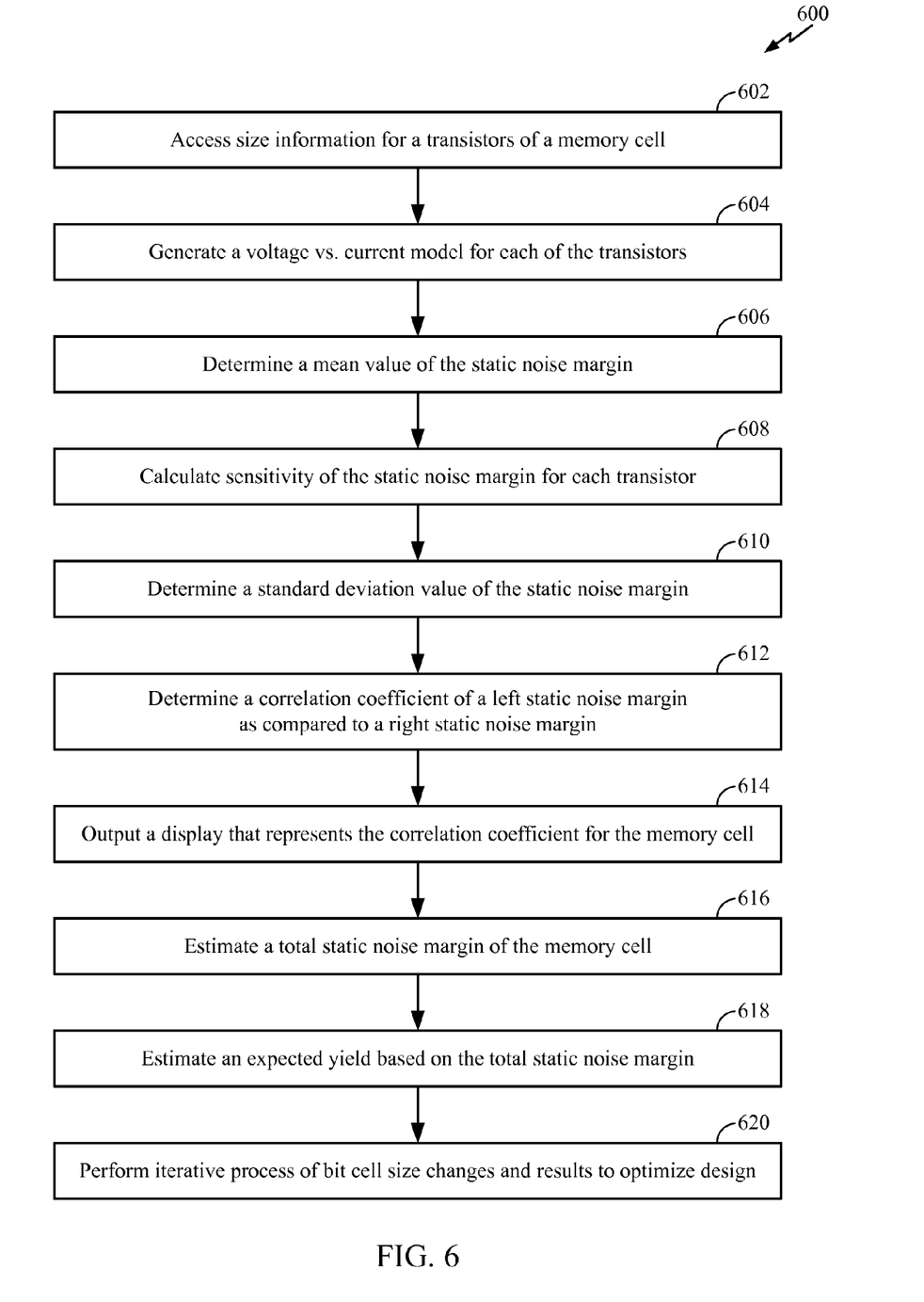
FIG. 6 is a flowchart illustrating a particular embodiment of a method executable by the system of FIG. 2 for estimating the total static noise margin for the memory cell of FIG. 1.

FIG. 6 shows a flowchart that illustrates a particular embodiment of a method 600 of estimating a total static noise margin of a bit cell of a memory based on a left side static noise margin of the bit cell and a right side static noise margin of the bit cell. In one embodiment of the method, size information is accessed for a transistor of the memory cell, at 602. For example, the width- and length-related information of the MOSFETs of an SRAM may be determined.

At 604, a voltage versus current model may be automatically calculated for each of the transistors to generate a voltage transfer curve and to calculate right and left static noise margins for the bit cell. For example, a butterfly curve that includes portions representing transfer characteristics of multiple inverters of a memory cell may be generated.

A mean value of the right and left static noise margins of the bit cell may be determined, at 606. An illustrative mean value may be automatically calculated using a generated butterfly curve. At 608, a sensitivity of the static noise margin calculations may be determined for each of the transistors PU1, PU2, PD1, PD2, AX1, and AX2 of FIG. 1. For instance, the sensitivity may be automatically calculated according to: $\partial SNM_{MOSFET}/\partial V_{thMOSFET}$.

A standard deviation value of the static noise margin of the bit cell may be determined, at 610. For example, the standard deviation of the static noise margin may be automatically calculated according to: $\sigma_{SNM}=\text{sqrt}[(\sigma_{Vt\_PU1}\times\partial SNM_{PU1}/ \partial V_{th\_PU1})^2+(\sigma_{Vt\_PU2}\times\partial SNM_{PU2}/\partial V_{th\_PU2})^2+(\sigma_{Vt\_PD1}\times \partial SNM_{PD1}/\partial V_{th\_PD1})^2+(\sigma_{Vt\_PD2}\times\partial SNM_{PD2}/\partial V_{th\_PD2})^2+ (\sigma_{Vt\_AX1}\times\partial SNM_{AX1}/\partial V_{th\_AX1})^2+(\sigma_{Vt\_AX2}\times\partial SNM_{AX2}/ \partial V_{th\_AX2})^2]$.

At 612, the method 600 may determine a correlation coefficient of a left static noise margin as compared to a right static noise margin. For example, the correlation coefficient may be automatically calculated according to: $\rho_{SNM_L}, \rho_{SNM_R} = [\partial SNM_{L_{PU1}}/\partial V_{th_{PU1}}\times\partial SNM_{R_{PU1}}/\partial V_{th_{PU1}}\times\sigma_{Vt_{PU1}}^2+\partial SNM_{L_{PU2}}/ \partial V_{th_{PU2}}\times\partial SNM_{R_{PU2}}/\partial V_{th_{PU2}}\times\sigma_{Vt_{PU2}}^2+\partial SNM_{L_{PD1}}/\partial V_{th_{PD1}}\times\partial SN M_{R_{PD1}}/\partial V_{th_{PD1}}\times\sigma_{Vt_{PD1}}^2+\partial SNM_{L_{PD2}}/\partial V_{th_{PD2}}\times\partial SNM_{R_{PD2}}/ \partial V_{th_{PD2}}\times\sigma_{Vt_{PD2}}^2+\partial SNM_{L_{AX1}}/\partial V_{th_{AX1}}\times\partial SNM_{R_{AX1}}/\partial V_{th_{AX1}}\times \sigma_{Vt_{AX1}}^2+\partial SNM_{L_{AX2}}/\partial V_{th_{AX2}}\times\partial SNM_{R_{AX2}}/\partial V_{th_{AX2}}\times\sigma_{th_{AX2}}^2]/\sigma_{SNM}^2$.

At 614, a display that represents the correlation coefficient may be output. The display may include a curve. For example, a curve may be generated by plotting points on a graph representative of a correlation between the left and right components of static noise margin.

A total static noise margin of the bit cell may be estimated by evaluating an analytical function based on the mean value, the standard deviation value, and the correlation coefficient, at 616. For example, the total static noise margin may be determined as a function of: $f_s(s)=2f_x(s)\times[1-\Phi(s-\mu(s))/\sigma]$, as described herein. The foregoing function may include a probability distribution function. In one embodiment, the generated probability distribution function includes the minimum value of either $SNM_R$ or $SNM_L$.

At 618, an expected yield may be estimated based on the total static noise margin. An iterative process of bit cell size changes and results may be performed repeating the above processes to modify and to enhance a design, at 620. The system 200 and the method 600 may facilitate "what if" design scenarios of memory cells with different parameters to arrive at a desired memory cell design, such as the memory cell design 100 of FIG. 1. For instance, the method 600 may continuously adjust component values and evaluate their impact on estimations of the static noise margin.

Figure 7:
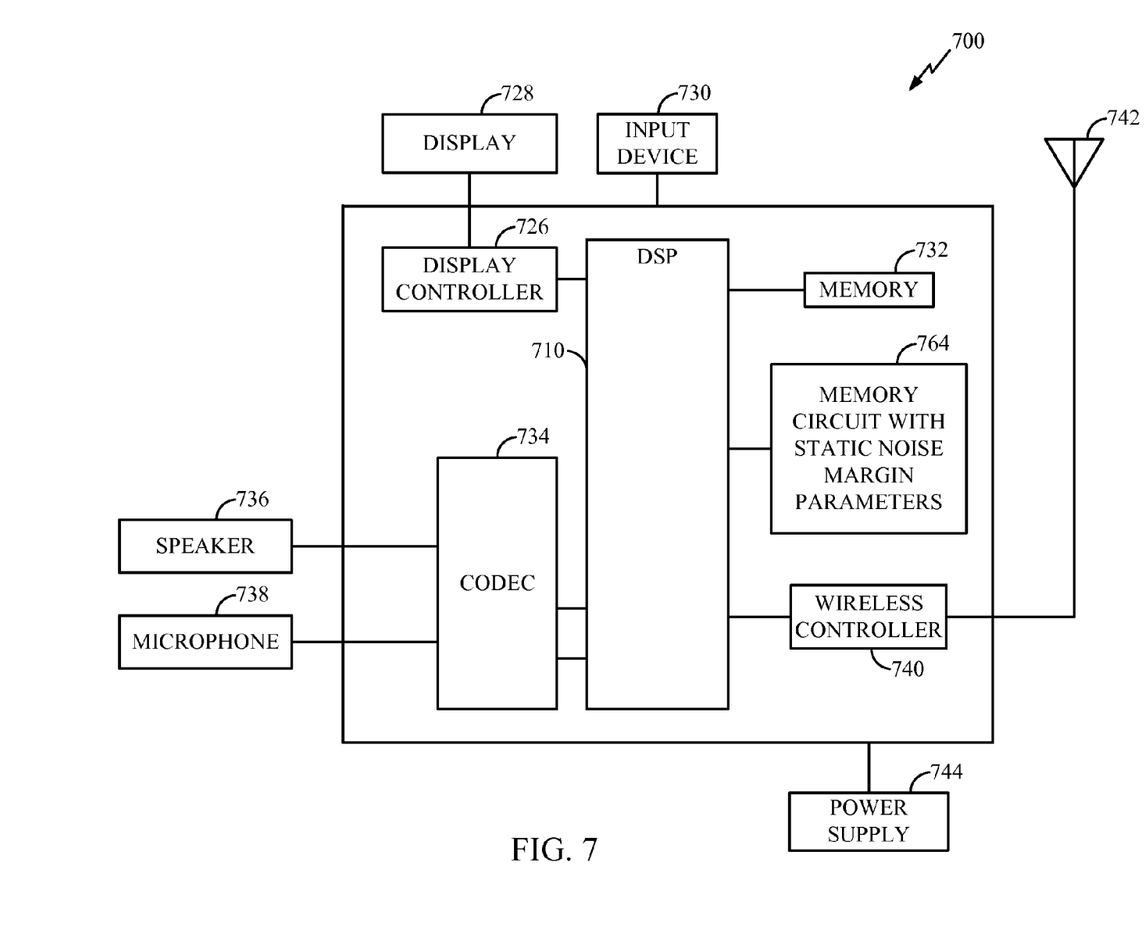
FIG. 7 is a block diagram of an illustrative embodiment of an electronic device including a memory circuit designed according to the method of FIG. 6.

Referring to FIG. 7, a block diagram of a particular illustrative embodiment of an electronic device including a memory circuit 764 designed according to the processes of FIG. 6, as described herein, is depicted and generally designated 700. The device 700 includes a processor, such as a digital signal processor (DSP) 710, coupled to a memory 732 and also coupled to a memory circuit 764 that has an estimated total static noise margin. In an illustrative example, the memory circuit 764 includes the memory cell 100 depicted in FIG. 1 and has circuit parameters determined using the method 600 of FIG. 6, the device 200 of FIG. 2, or any combination thereof. In a particular embodiment, the memory circuit 764 includes an SRAM memory.

FIG. 7 also shows a display controller 726 that is coupled to the digital signal processor 710 and to a display 728. A coder/decoder (CODEC) 734 can also be coupled to the digital signal processor 710. A speaker 736 and a microphone 738 can be coupled to the CODEC 734.

FIG. 7 also indicates that a wireless controller 740 can be coupled to the digital signal processor 710 and to a wireless antenna 742. In a particular embodiment, the DSP 710, the display controller 726, the memory 732, the CODEC 734, the memory circuit 736, and the wireless controller 740 are included in a system-in-package or system-on-chip 722. In a particular embodiment, an input device 730 and a power supply 744 are coupled to the on-chip system 722. Moreover, in a particular embodiment, as illustrated in FIG. 7, the display 728, the input device 730, the speaker 736, the microphone 738, the wireless antenna 742, and the power supply 744 are external to the on-chip system 722. However, each can be coupled to a component of the on-chip system 722, such as an interface or a controller.

In a particular embodiment, the disclosed methodology may be implemented in connection with a circuit design tool to design and manufacture circuit devices. For example, circuit information may be received at an automated circuit design system, the circuit information related to a memory circuit. A total static noise margin of the circuit may be calculated. An example of calculating the total static noise margin is calculating the right and left static noise margins. The total static noise margin may be displayed via the automated circuit design system otherwise provided to a user of the automated circuit design system. The circuit and/or physical parameter values of the circuit or calculated results may be displayed, graphically or otherwise. The total static noise margin may be compared to a threshold that may be determined based on a desired manufacturing yield of a memory. Based on the comparison, modified parameters of a second circuit may be requested, a next iteration of an iterative design adjustment process may be initiated, or an indication may be generated that the circuit information is approved for fabrication. Once the circuit has been approved for fabrication, the circuit may be incorporated into a design file and injected into the manufacturing process, as described in FIG. 8.

Figure 8:
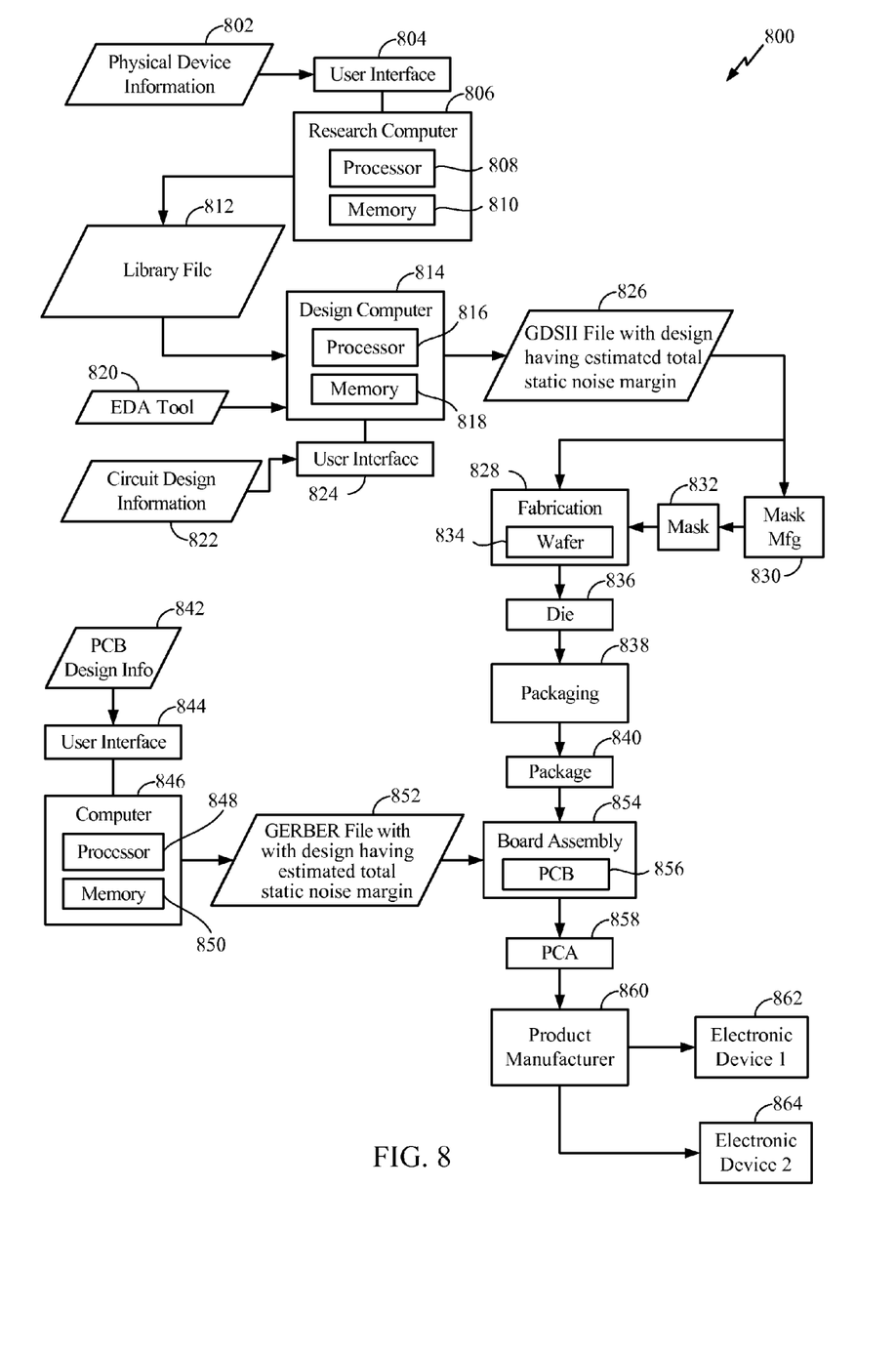
FIG. 8 is a flowchart illustrating a particular illustrative embodiment of an electronic device manufacturing process for manufacturing the SRAM memory cell design of FIG. 1.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 8 depicts a particular illustrative embodiment of an electronic device manufacturing process 800.

Physical device information 802 is received in the manufacturing process 800, such as at a research computer 806. The physical device information 802 may include design information representing at least one physical property of a semiconductor device, such as the memory cell design 100 of FIG. 1. For example the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including the transformed design information. For example, the library file 812 may include a library of semiconductor devices, such as the memory circuit 100 of FIG. 1, which is provided for use with an electronic design automation (EDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a circuit using, for example, the circuit parameter values 214 of FIG. 2, of the library file 812. For example, a user of the design computer 814 may enter circuit design information 822 via a user interface 824 coupled to the design computer 814. The circuit design information 822 may include design information representing at least one physical property of a semiconductor device, such as the memory circuit 100 of FIG. 1. To illustrate, the circuit design property may include identification of particular circuits and relationships to other elements in a circuit design, positioning information, feature size information, interconnection information, or other information representing a physical property of a semiconductor device. For example, the EDA tool 820 may be executable by the processor 816 to perform the method 600 of FIG. 6. In an illustrative embodiment, the design computer 814 is the system 200 of FIG. 2.

The design computer 814 may be configured to transform the design information, including the circuit design information 822 to comply with a file format. To illustrate, the file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing the memory cell design 100 of FIG. 1, in addition to other circuits or information. To illustrate, the data file may include information corresponding to a system-on-chip (SOC) that includes the memory cell design 100 of FIG. 1 and that also includes additional electronic circuits and components within the SOC.

The GDSII file 826 may be received at a fabrication process 828 to manufacture the memory cell design 100 of FIG. 1 according to transformed information in the GDSII file 826. For example, a device manufacture process may include providing the GDSII file 826 to a mask manufacturer 830 to create one or more masks, such as masks to be used for photolithography processing, illustrated as a representative mask 832. The mask 832 may be used during the fabrication process to generate one or more wafers 834, which may be tested and separated into dies, such as a representative die 836. The die 836 may include a circuit including the memory cell design 100 of FIG. 1.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840 including the memory cell design 100 of FIG. 1.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the memory cell design 100 of FIG. 1. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines for performing various steps of a PCB production process. The PCB 856 may be populated with electronic components including the package 840 to form a representative printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1-8 may illustrate remote units according to the teachings of the disclosure, the disclosure is not limited to these illustrated units. Embodiments of the disclosure may be suitably employed in any device which includes active integrated circuitry including memory and on-chip circuitry for test and characterization.

Thus, the memory cell design 100 of FIG. 1 may be fabricated, processed, and incorporated into an electronic device, as described in the illustrative process 800. One or more aspects of the embodiments disclosed with respect to FIGS. 1-8 may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity, or by one or more entities performing various stages of the process 800.

Those of skill would further appreciate that the various illustrative logical blocks, configurations, modules, circuits, and algorithm steps described in connection with the embodiments disclosed herein may be implemented as electronic hardware, computer software executing at a computer or hardware processor, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in a tangible storage medium such as random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An illustrative storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A method of designing a memory device to have an estimated yield that satisfies a desired manufacturing yield, the method comprising:
   designing a circuit corresponding to a memory device that includes a bit cell;
   storing a data file including a circuit layout and parameters of the circuit;
   accessing, by a processor programmed to execute circuit simulation instructions, size information from the data file for each of a plurality of transistors within the bit cell, wherein the plurality of transistors includes every transistor in the bit cell;
   calculating, at the processor, a voltage versus current model for each of the plurality of transistors to generate a voltage transfer curve and to calculate a static noise margin for the bit cell based on static noise margin calculations of the plurality of transistors;
   determining, at the processor, a mean value of the static noise margin of the bit cell;
   determining, at the processor, a sensitivity of each of the static noise margin calculations for each of the plurality of transistors;
   determining, at the processor, a standard deviation value of the bit cell;
   determining, at the processor, a correlation coefficient of a left static noise margin as compared to a right static noise margin of the bit cell, wherein the correlation coefficient is based on the sensitivity of each of the static noise margin calculations of each of the plurality of transistors;
   estimating, at the processor, a total static noise margin of the bit cell by evaluating an analytical function based on the mean value, the standard deviation value, and the correlation coefficient;
   comparing the total static noise margin to a threshold, wherein the threshold is based on the desired manufacturing yield; and
   in response to the comparison of the total static noise margin to the threshold indicating that the diameter manufacturing yield is not satisfied, modifying one or more physical parameters of the circuit to generate a modified total static noise margin.

2. The method of claim 1, wherein the analytical function is a probability distribution function.

3. The method of claim 1, further comprising estimating, at the processor, an expected yield based on the total static noise margin.

4. The method of claim 1, further comprising performing, at the processor, an iterative process of bit cell size changes and results.

5. The method of claim 1, further comprising outputting, from the processor, a display that represents the correlation coefficient.

6. The method of claim 5, wherein the display comprises a graphical display of a curve.

7. A method of estimating a total static noise margin of a bit cell of a memory, the method comprising:
   determining, at a processor, a correlation coefficient of a left static noise margin as compared to a right static noise margin of the bit cell, wherein the correlation coefficient is based on a sensitivity of static noise margin calculations of each of a plurality of transistors included in the bit cell, wherein the plurality of transistors includes every transistor in the bit cell; and
   estimating, at the processor, the total static noise margin of the bit cell by evaluating an analytical function based on the correlation coefficient.

8. The method of claim 7, wherein the analytical function is further based on a mean value of either a left static noise margin or a right static noise margin and the analytical function is further based on a standard deviation value of either the left static noise margin or the right static noise margin.

9. The method of claim 7, further comprising:
   accessing size information for each of a plurality of transistors within the bit cell;
   calculating, at the processor, a voltage versus current model for each of the transistors to generate a voltage transfer curve and to calculate a static noise margin for the bit cell based on the static noise margin calculations for each of the plurality of transistors;
   determining, at the processor, a mean value of the static noise margin of the bit cell;
   determining, at the processor, a sensitivity of each of the static noise margin calculations for each of the plurality of transistors; and
   determining, at the processor, a standard deviation value of the bit cell before determining the correlation coefficient.

10. The method of claim 7, wherein the analytical function is a probability distribution function.

11. The method of claim 7, further comprising estimating, at the processor, an expected yield based on the total static noise margin.

12. The method of claim 7, further comprising performing an iterative process of bit cell size changes and results.

13. The method of claim 7, further comprising outputting a display that represents the correlation coefficient.

14. The method of claim 9, wherein the standard deviation value is determined according to $\text{sqrt}[(\sigma_{Vt\_PU1} \times \partial SNM_{PU1}/\partial V_{th\_PU1})^2 + (\sigma_{Vt\_PU2} \times \partial SNM_{PU2}/\partial V_{th\_PU2})^2 + (\sigma_{Vt\_PD1} \times \partial SNM_{PD1}/\partial V_{th\_PD1})^2 + (\sigma_{Vt\_PD2} \times \partial SNM_{PD2}/\partial V_{th\_PD2})^2 + (\sigma_{Vt\_PU1} \times \partial SNM_{AX1}/\partial V_{th\_AX1})^2 + (\sigma_{Vt\_AX2} \times \partial SNM_{AX2}/\partial V_{th\_AX2})^2]$, wherein $\sigma_{Vt}$ comprises a standard deviation, $V_{th}$ comprises a threshold voltage, SNM comprises a static noise margin, and wherein PD1, PD2, PU1, PU2, AX1, and AX2 indicate respective transistors of the plurality of transistors.

15. A non-transitory computer readable medium storing computer executable code for estimating a total static noise margin of a bit cell of a memory, the computer executable code comprising:
   code executable by a computer to determine a correlation coefficient of a left static noise margin as compared to a right static noise margin of the bit cell, wherein the correlation coefficient is based on a sensitivity of static noise margin calculations of each of a plurality of transistors included in the bit cell, wherein the plurality of transistors includes every transistor in the bit cell; and
   code executable by the computer to estimate a total static noise margin of the bit cell by evaluating an analytical function based on the correlation coefficient.

16. The non-transitory computer readable medium of claim 15, further comprising code executable by the computer to
- access size information for each of a plurality of transistors within the bit cell:
- calculate a voltage versus current model for each of the transistors to generate a voltage transfer curve and to calculate a static noise margin for the bit cell based on the static noise margin calculations of each of the plurality of transistors; to determine a mean value of the static noise margin of the bit cell;
- determine the sensitivity of each of the static noise margin calculations for each of the plurality of transistors; and
- determine a standard deviation value of the bit cell.

17. The non-transitory computer readable medium of claim 15, wherein the analytical function is a probability distribution function.

18. The non-transitory computer readable medium of claim 15, further comprising code executable by the computer to estimate an expected yield based on the total static noise margin.

19. The non-transitory computer readable medium of claim 15 further comprising code executable by the computer to perform an iterative process of bit cell size changes and results.

20. An apparatus for estimating a total static noise margin of a bit cell of a memory, the apparatus comprising:
- means for determining a correlation coefficient of a left static noise margin as compared to a right static noise margin of the bit cell, wherein the correlation coefficient is based on a sensitivity of static noise margin calculations of each of a plurality of transistors included in the bit cell, wherein the plurality of transistors includes every transistor in the bit cell; and
- means for estimating a total static noise margin of the bit cell by evaluation an analytical function based on the correlation coefficient.

21. The apparatus of claim 20 integrated in at least one semiconductor die.

22. The apparatus of claim 20, further comprising a device selected from the group consisting of a set top box, a music player, a video player, an entertainment unit, a navigation device, a communications device, a personal digital assistant (PDA), a fixed location data unit, and a computer, into which the apparatus is integrated.

23. An apparatus for designing a bit cell memory design, the apparatus comprising:
- a processor; and a memory including code executable by the processor to:
- determine a correlation coefficient of a left static noise margin as compared to a right static noise margin of the bit cell, wherein the correlation coefficient is based on a sensitivity of static noise margin calculations of each of a plurality of transistors included in the bit cell, wherein the plurality of transistors includes every transistors in the bit cell;
- estimate a total static noise margin of the bit cell by evaluating an analytical function based on the correlation coefficient; and
- perform an iterative process of bit cell parameter changes to modify the bit cell memory design.

24. The apparatus of claim 23 integrated in at least one semiconductor die.

25. A method comprising:
- receiving a data file including design information corresponding to a semiconductor device; and
- fabricating, at a circuit design system, the semiconductor device according to the design information, wherein the semiconductor device includes a plurality of bit cells and wherein the design information includes bit cell parameters that are determined by an interactive process that includes:
- determining, via a computing unit or circuitry, a correlation coefficient of a left static noise margin of as compared to a right static noise margin of the bit cell, wherein the correlation coefficient is based on a sensitivity of static noise margin calculations of each of a plurality of transistors included in the bit cell, wherein the plurality of transistors includes every transistor in the bit cell;
- estimating a total static noise margin of the bit cell by evaluating an analytical function based on the correlation coefficient; and
- performing an iterative process of bit cell parameter changes to modify the bit cell memory design.

26. The method of claim 25, further comprising integrating the semiconductor device into a device selected from the group consisting of a set top box, a music player, a video player, an entertainment unit, a navigation device, a communications device, a personal digital assistant (PDA), a fixed location data unit, and a computer.

27. A method comprising:
- receiving design information including physical positioning information of a packaged semiconductor device on a circuit board, the packaged semiconductor device including a semiconductor structure, wherein the semiconductor structure includes a plurality of bit cells and wherein the design information includes bit cell parameters that are determined by an interactive process that includes:
- determining a correlation coefficient of a left static noise margin as compared to a right static noise margin of the bit cell, wherein the correlation coefficient is based on a sensitivity of static noise margin calculations of each of a plurality of transistors included in the bit cell, wherein the plurality of transistors includes every transistor in the bit cell;
- estimating a total static noise margin of the bit cell by evaluating an analytical function based on the correlation coefficient; and
- performing an iterative process of bit cell parameter changes to modify the bit cell memory design; and
- transforming, via a computing unit or circuitry, the design information to generate a data file.

28. The method of claim 27, wherein the data file has a GDSII format.

29. The method of claim 27, wherein the data file has a GERBER format.

30. The method of claim 27, further comprising integrating the circuit board into a device selected from the group consisting of a set top box, a music player, a video player an entertainment unit, a navigation device, a communications device, a personal digital assistant (PDA), a fixed location data unit, and a computer.

31. A method comprising:
- a first step for determining, at a processor, a correlation coefficient of a left static noise margin as compared to a right static noise margin of the bit cell, wherein the correlation coefficient is based on a sensitivity of static noise margin calculations of each of a plurality of transistors included in the bit cell, wherein the plurality of transistors includes every transistor in the bit cell; and
- a second step for estimating, at the processor a total static noise margin of the bit cell by evaluating an analytical function based on the correlation coefficient.

32. The method of claim 31, wherein the first step and the second step are performed by the processor integrated into an electronic device.

33. The method of claim 7, wherein determining the correlation coefficient comprises calculating a left static noise margin effect associated with each transistor of the plurality of transistors by measuring a first effect of changes in a left threshold voltage of the associated transistor on a left static noise margin of the associated transistor by measuring a second effect of changes in a right threshold voltage of the associated transistor on a right static noise margin of the associated transistor.

34. The method of claim 33, wherein determining the correlation coefficient further comprises calculating a total static noise margin effect associated with each transistor of the plurality of transistors, wherein estimating the total static noise margin comprises multiplying the first effect of the left static noise margin of the associated transistor with the second effect of the right static noise margin of the associated transistor.

35. The method of claim 34, wherein the correlation coefficient is determined according to $[\partial SNM_{L_{PU1}}/\partial V_{th_{PU1}} \times \partial SNM_{R_{PU1}}/\partial V_{th_{PU1}} \times \sigma_{Vt_{PU1}}^2 + \partial SNM_{L_{PU2}}/\partial V_{th_{PU2}} \times \partial SNM_{R_{PU2}}/\partial V_{th_{PU2}} \times \sigma_{Vt_{PU2}}^2 + \partial SNM_{L_{PD1}}/\partial V_{th_{PD1}} \times \partial SNM_{R_{PD1}}/\partial V_{th_{PD1}} \times \sigma_{Vt_{PD1}}^2 + \partial SNM_{L_{PD2}}/\partial V_{th_{PD2}} \times \partial SNM_{R_{PD2}}/\partial V_{th_{PD2}} \times \sigma_{Vt_{PD2}}^2 + \partial SNM_{L_{AX1}}/\partial V_{th_{AX1}} \times \partial SNM_{R_{AX1}}/\partial V_{th_{AX1}} \times \sigma_{Vt_{AX1}}^2 + \partial SNM_{L_{AX2}}/\partial V_{th_{AX2}} \times \partial SNM_{R_{AX2}}/\partial V_{th_{AX2}} \times \sigma_{Vt_{AX2}}^2]/\sigma_{SNM}^2$, wherein σ comprises a standard deviation, $V_{th}$ comprises a threshold voltage, SNM comprises a static noise margin, and wherein PD1, PD2, PU1, PU2, AX1, and AX2 indicate respective transistors of the plurality of transistors.

36. The method of claim 1, wherein the modified total static noise margin satisfies the threshold.

37. The method of claim 1, wherein the analytical function is evaluated according to $f_s(S)=2f_x(s)\times[1-\Phi((s-\mu(S))/\sigma)]$, wherein $f_x(x)=[1/(\sigma_{SNM}\sqrt{(2\pi)})]\times e^{-(X-\mu SNM)^2/(2\tau SNM^2)}$, wherein μ(x) is determined according to: $\mu_{SNM} + \rho_{SNM_L}$, $\rho_{SNM_R \times (X-\mu SNM)}$, wherein $\sigma = \sigma_{SNM} \times sqrt(1-\rho_{SNM_L}, \rho_{SNM_R}^2)$, wherein $\sigma_{SNM}$ comprises the standard deviation value, wherein $\mu_{SNM}$ comprises the mean value, wherein $\rho_{SNM_L}$, $\rho_{SNM_R}$ comprises the correlation coeffiecient, wherein Φ (X) comprises a cumulative distribution function, wherein s comprises a first value associated with a first parameter, and wherein x comprises a second value associated with a second parameter.

* * * * *

UNITED STATES PATENT AND TRADEMARK OFFICE
CERTIFICATE OF CORRECTION

PATENT NO. : 8,447,547 B2  
APPLICATION NO. : 12/485969  
DATED : May 21, 2013  
INVENTOR(S) : Seong-Ook Jung et al.

Page 1 of 1

It is certified that error appears in the above-identified patent and that said Letters Patent is hereby corrected as shown below:

Title Page, item [73], After the first assignee, add the following:

Industry-Academic Cooperation Foundation, Yonsei University, Seoul, (KR)

To be listed as follows:

[73] Assignees: QUALCOMM Incorporated, San Diego, CA (US)
Industry-Academic Cooperation Foundation, Yonsei University, Seoul, (KR)

Signed and Sealed this
Twenty-fifth Day of February, 2014

Michelle K. Lee
*Deputy Director of the United States Patent and Trademark Office*